United States Patent
Erickson et al.

(10) Patent No.: US 6,984,869 B2
(45) Date of Patent: Jan. 10, 2006

(54) HIGH PERFORMANCE DIODE IMPLANTED VOLTAGE CONTROLLED P-TYPE DIFFUSION RESISTOR

(75) Inventors: Sean Christopher Erickson, Fort Collins, CO (US); Kevin Roy Nunn, Fort Collins, CO (US); Jonathan Alan Shaw, Fort Collins, CO (US)

(73) Assignee: LSI Logic Corporation, Milpitas, CA (US)

(*) Notice: Subject to any disclaimer, the term of this patent is extended or adjusted under 35 U.S.C. 154(b) by 168 days.

(21) Appl. No.: 10/730,554

(22) Filed: Dec. 8, 2003

(65) Prior Publication Data

US 2005/0121746 A1    Jun. 9, 2005

(51) Int. Cl.
    *H01L 29/00*    (2006.01)
(52) U.S. Cl. .............. 257/536; 257/537; 257/516; 257/379; 438/382; 438/383; 438/381; 438/384
(58) Field of Classification Search .......... 257/536, 257/537, 516, 379; 438/382, 383, 381, 384
See application file for complete search history.

(56) References Cited

U.S. PATENT DOCUMENTS

| | | | | |
|---|---|---|---|---|
| 5,786,616 A | * | 7/1998 | Fukumoto et al. | 257/358 |
| 6,150,871 A | * | 11/2000 | Yee | 327/538 |
| 6,300,668 B2 | * | 10/2001 | Miller et al. | 257/536 |

* cited by examiner

*Primary Examiner*—Nathan J. Flynn
*Assistant Examiner*—Remmon R. Fordé
(74) *Attorney, Agent, or Firm*—Yee & Associates, P.C.

(57) ABSTRACT

The present invention provides a diffusion resistor that is formed in the substrate. A diffusion region is formed within the substrate that contains first and second contact regions extending downward from the surface of the substrate. Third and fourth contacts are also located within the diffusion region between the first and second contacts and define a conduction channel therebetween. This contact also extends downward from the surface of the substrate. These contacts are connected to metal layers. The first and second contacts form the two ends of the diffusion resistor; the third and fourth contacts connect to N+p− diodes such that application of a voltage to these contacts forms respective depletion regions within the diffusion region. The depletion regions change in size depending on the voltage applied to their respective contact, thereby changing the resistance of the depletion resistor.

19 Claims, 5 Drawing Sheets

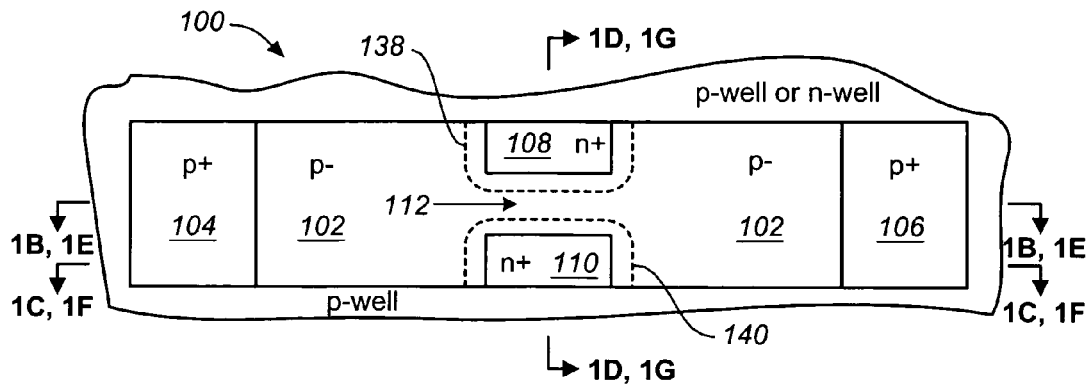
FIG._1A
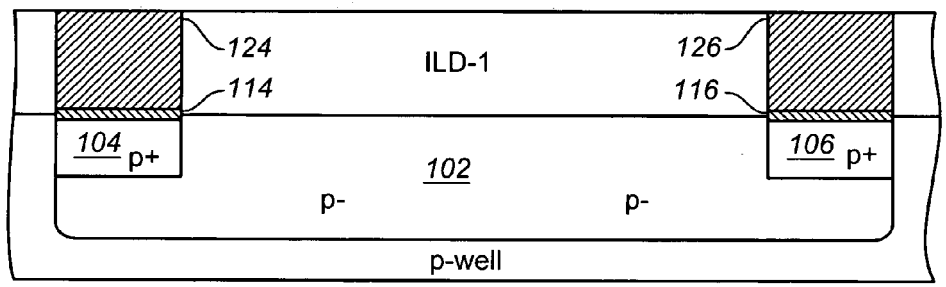
FIG._1B
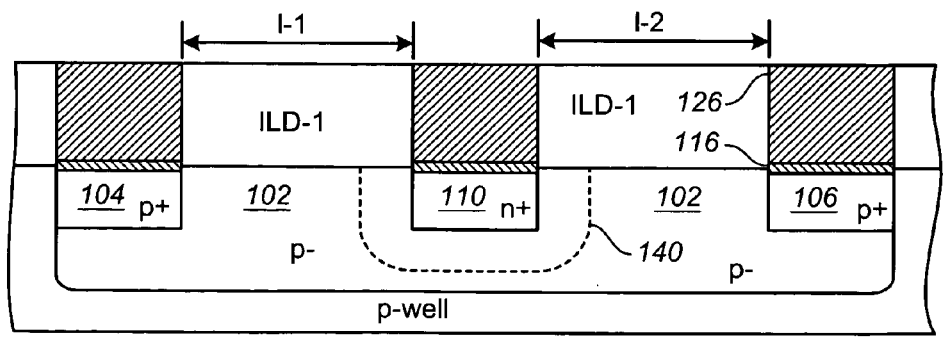
FIG._1C

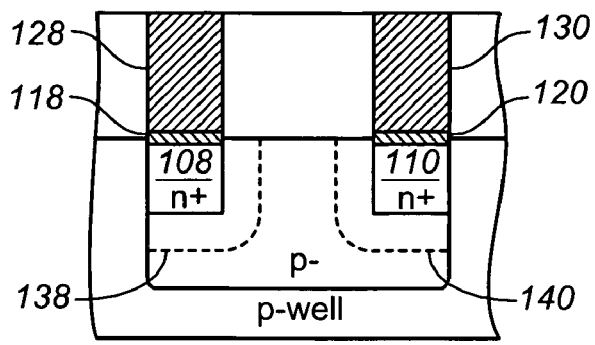
FIG._1D
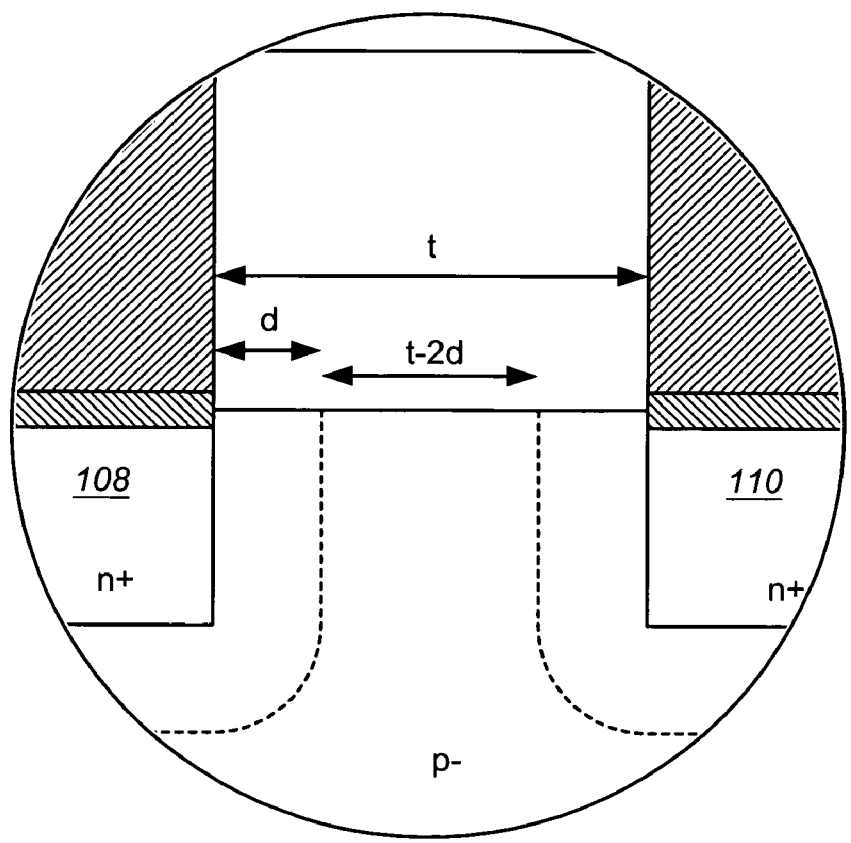
FIG._1E

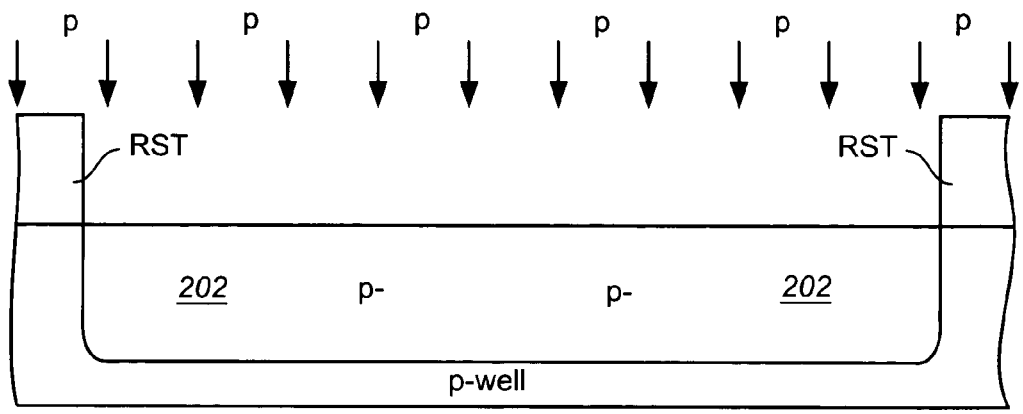
FIG._2A
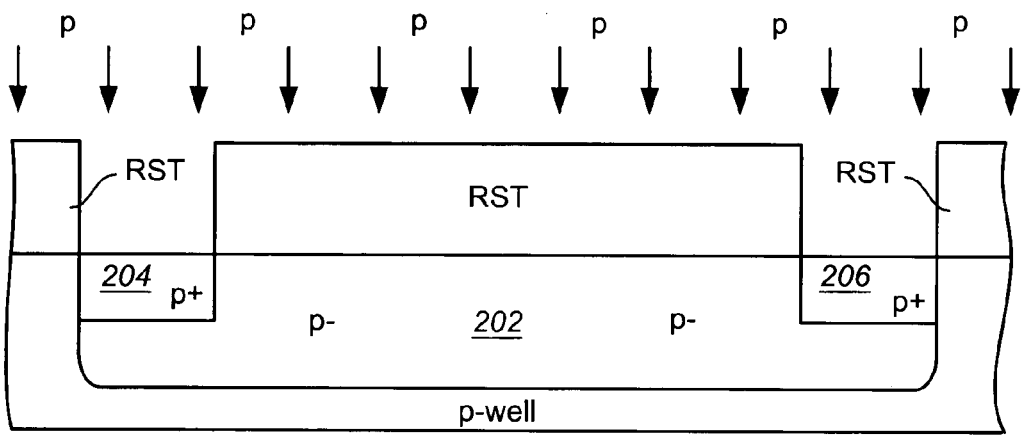
FIG._2B
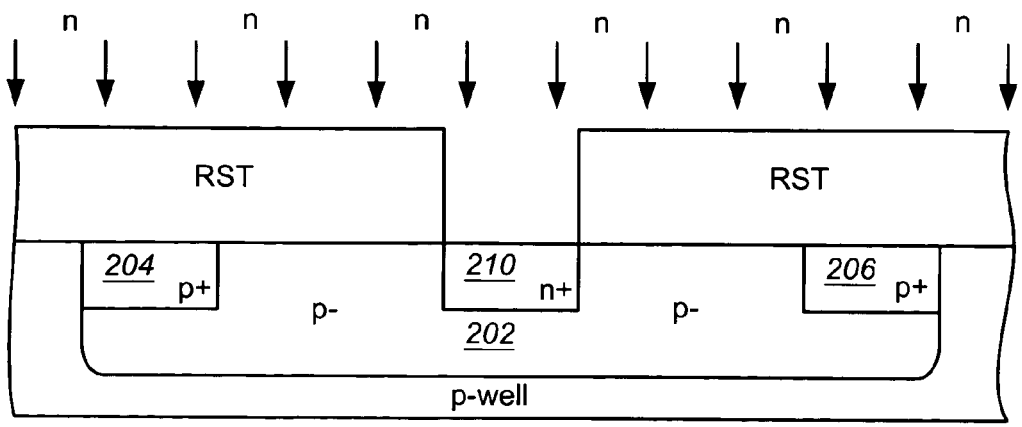
FIG._2C

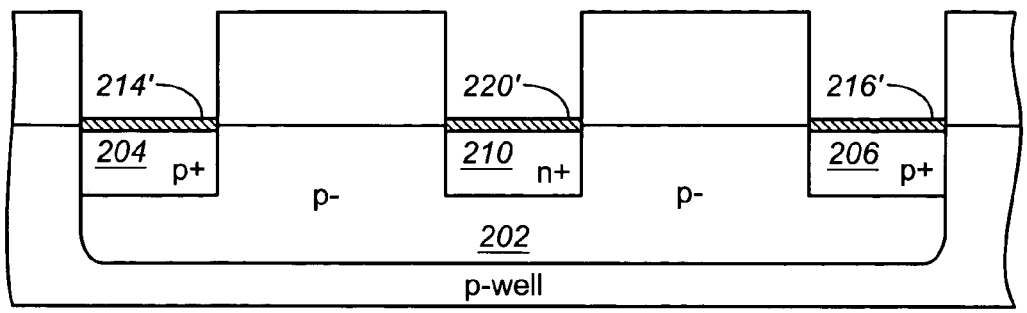
FIG._2D
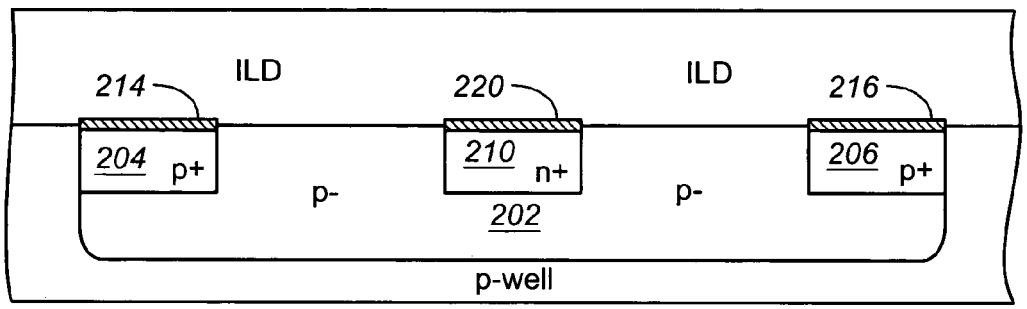
FIG._2E
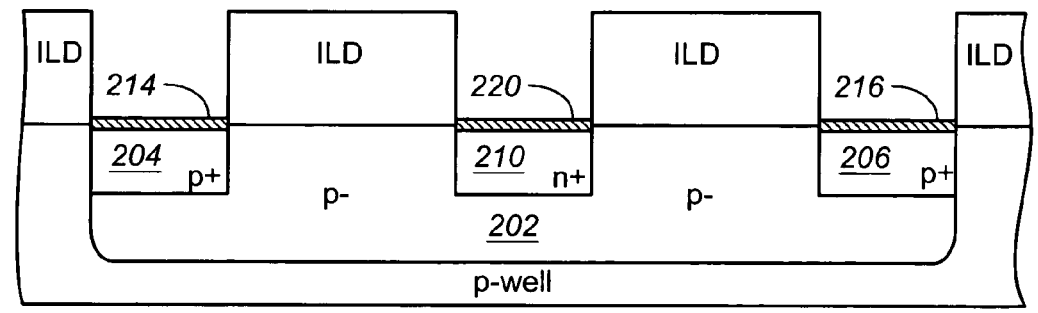
FIG._2F
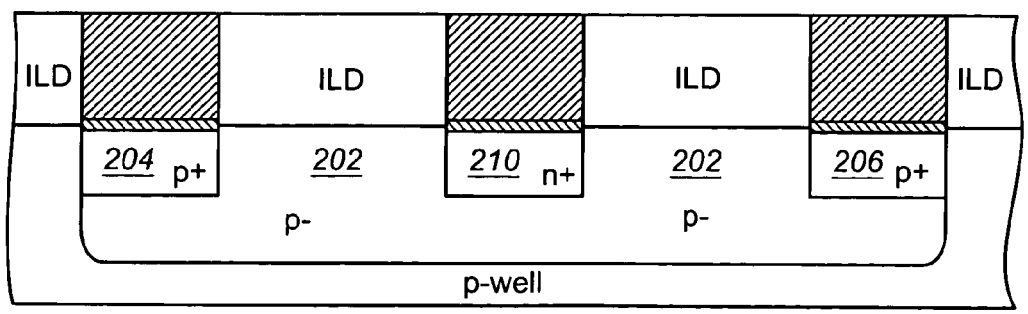
FIG._2G

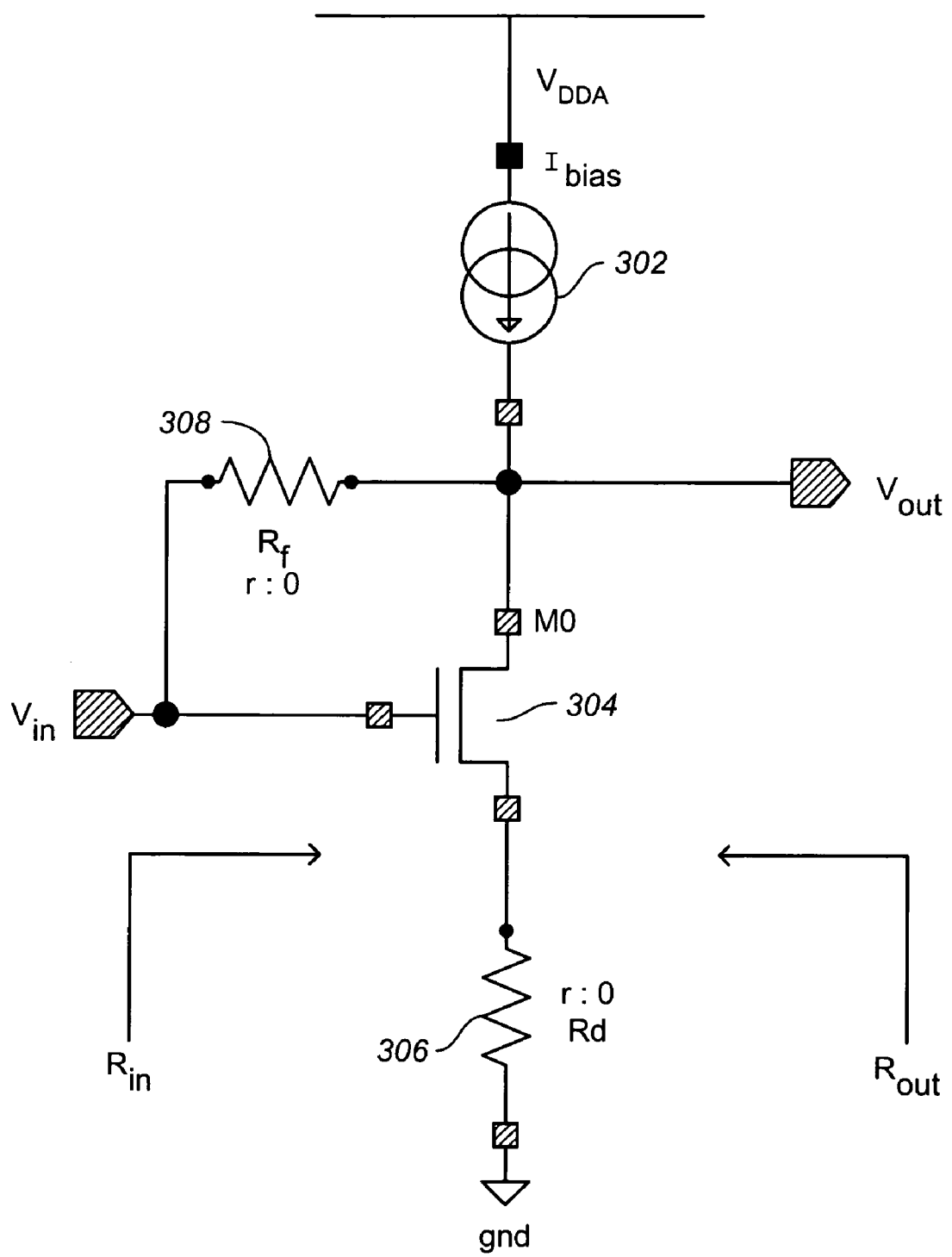
FIG._3

HIGH PERFORMANCE DIODE IMPLANTED VOLTAGE CONTROLLED P-TYPE DIFFUSION RESISTOR

BACKGROUND OF THE INVENTION

1. Technical Field

The present invention relates generally to an improved circuit system and in particular to a resistor. Still more particularly, the present invention relates to a precision voltage controlled diffusion resistor.

2. Description of the Related Art

A resistor is an electrical device that may convert energy into heat. The letter R is used to denote the resistance value of a resistor. With this device, two possible reference choices are present for the current and voltage at the terminals of the resistor. One is current in the direction of the voltage drop across the resistor and another is the current in the direction of voltage rise across the resistor.

Some existing problems with respect to resistors include transmission line impedance mismatching (caused by line width variations through etching), the physical size required for diffusion resistors, and process variation in diffusion resistors. Currently, existing solutions for these problems include special Microwave Integrated Circuit (MIC) processes to make trimmed resistors. This type of process involves using a laser to trim the resistors. The resistance is measured and a laser is used to reduce the size of the resistor. This type of process requires much time and is expensive to perform on a per circuit basis. Alternatively, high-precision discrete components are soldered or bonded to an integrated circuit (IC) or package. These currently used solutions are expensive with respect to the manufacturing of semiconductors. Further, these existing solutions are difficult to integrate into a silicon IC process because of the size of components and/or specialized manufacturing requirements needed to trim the devices. Further, discrete or trimmed components are not adjustable after the manufacture of a product.

Therefore, it would be advantageous to have an improved diffusion resistor that overcomes the problems of the existing solutions.

SUMMARY OF THE INVENTION

The present invention provides a p-type diffusion resistor that is formed in the substrate. A p-type diffusion region is formed within the substrate that contains first and second p+ contact regions at either end of the diffusion region to form the two ends of the diffusion resistor. Third and fourth contact regions, both n+ regions, are located within the diffusion region between the first and second contacts and on either side of the conduction channel between the two end points. The third and fourth contacts form diodes such that the application of a voltage to these contacts causes respective depletion regions surrounding the contacts. All of the contacts are connected to metal layers overlying the resistor. The depletion regions surrounding the third and fourth contacts change in size depending on the voltage applied to their respective contacts. Increasing the size of the depletion regions increases the resistance of the depletion resistor by narrowing the conduction channel between the two contacts.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1A is a view looking down on the surface of a voltage-controlled diffusion resistor after the regions have been implanted but before contacts are added, in accordance with a preferred embodiment of the present invention;

FIGS. 1B–1D are cross-sections of the voltage controlled diffusion resistor of FIG. 1A, shown after contacts have been formed. These figures demonstrate contacts with a salicide on the substrate under the contact for both diodes and endpoints of the resistor;

FIG. 1E is an enlargement of the central region of FIG. 1D, showing the distances in terms of the depletion regions;

FIGS. 2A–2G are diagrams illustrating the cross-section of the resistor shown in FIG. 1C at various processing steps for creating the resistor in accordance with a preferred embodiment of the present invention; and FIG. 3 is a schematic diagram of a radio frequency (RF) driver or receiver circuit with RF feedback in accordance with a preferred embodiment of the present invention.

DETAILED DESCRIPTION

The present invention provides for an improved diffusion resistor that is voltage controlled. The illustrative embodiment of the present invention takes advantage of the fact that there exists a depletion region, a volume of the semiconductor devoid of charge carriers, whenever two oppositely doped concentrations come together. The depletion layer that results in the semiconductor may be used in conjunction with a voltage bias on the diode to reduce or increase the effective resistance of a diffusion resistor.

The structure of a high-precision voltage controlled diffusion resistor in the illustrative embodiments of the present invention includes a low mobility diffusion region with a positive contact at one end and a negative contact at the opposite end. The low mobility diffusion region defines a conduction channel. Near the center of the resistor, the sides of the conduction channel are defined by the two diodes, formed by a metal-to-silicon contact and an N-type doped implant. The negative and positive contact regions are typical ohmic contacts.

The resistance is made variable in these depicted examples through providing an ability to tune the resistor through voltage-controlled contacts (VCC) to each of the diodes. When the VCC contact is biased, the thickness of the depletion region is changed, which in turn changes the width of the conduction channel. As a result, an increase or decrease in effective resistance in the structure is created depending on the particular voltage applied to the VCC contact. In this manner, an ability to vary the resistance of the diffusion resistor through a voltage bias is accomplished.

The reduction in the conduction width allows the creation of a resistor of a higher value in the same space as a diffusion resistor that does not use a diode contact. This in turn provides for a reduction in physical resistor size. This advantage is accomplished in the depicted examples as explained here: A basic diffusion resistor has a conduction width "t", which is directly related to the amount of current it will conduct. In the innovative resistor, this width "t" is reduced by "2·d", where d is the width of each depletion region. Thus, the diffusion resistor of the present invention has a conduction thickness of "t−(2·d)". In these examples, the VCC may be tied to ground and an increase in the effective resistance still exists.

Advantages of the disclosed resistor include the ability to make a smaller resistor, to modulate the value of the resistor after manufacturing, to simplify the manufacturing of resistors of a given resistance. The resistance value can be elevated to an extreme value and can be used as a fail safe circuit.

The processes, steps, and structures described below do not form a complete process flow for manufacturing integrated circuits. The present invention can be practiced in conjunction with integrated circuit fabrication techniques currently used in the art, and only so much of the commonly practiced process steps are included as necessary for an understanding of the present invention. The figures below represent cross sections of a portion of an integrated circuit during fabrication and are not drawn to scale, but are drawn so as to illustrate the important features of the invention.

With reference now to the figures and in particular with reference to FIG. 1A, a top view of voltage-controlled diffusion resistor 100 is depicted in accordance with a preferred embodiment of the present invention. The resistor is formed in elongated region 102 of silicon substrate that has been lightly doped with a p-type dopant. The p-type dopant can be, for example, boron. Regions of heavier doping 104 and 106 at each end of resistor 100 provide positive and negative terminals of the resistor. Two n+ regions 108 and 110 are formed near the center of the resistor and define between them channel 112 through which a current can flow from one terminal to the other. The n+ contact regions form diodes and cause depletion regions 138 and 140 to form around them. The size of depletion regions 138 and 140 can be increased or decreased by the application of appropriate voltages.

FIGS. 1B–1D show cross-sections of voltage-controlled diffusion resistor 100 of FIG. 1A, after contacts have been formed. Because n+ regions 108 and 110 do not extend across the entire width of resistor 100, FIG. 1B, which looks at a section extending down the midline of the resistor, shows only p+ contact regions 104 and 106, while FIG. 1C, which looks at a section offset from the midline, shows both p+ regions 104 and 106 and n+ regions 108 and 110. FIG. 1D, which looks at a section through the midpoint of resistor 100 taken perpendicular to the section of FIG. 1B, shows only n+ regions 108, 110. Contact 124 and contact 126 for the terminals are formed on salicided regions 114 and 116. Salicided region 108 (not shown) is formed on n+ contact region 118 (also not shown), and salicided region 110 is formed on n+ contact region 120. These contacts are standard ohmic contacts formed by metal layers. Contact 104 in this example is a positive terminal for diffusion resistor 100, while contact 106 forms a minus terminal for diffusion resistor 100. Contacts 108 and 110 are voltage control contacts (VCC) for a diode. In this example, contact 130 is formed over salicided region 120 and contact area 110. Depending on the voltage bias applied to contact 110, depletion region 140 is formed and may grow or shrink.

FIG. 1E is an enlargement of the central region of FIG. 1D, showing the distances that are important in terms of the depletion regions. As voltage is applied to contacts 128 and 130, depletion regions 138 and 140 grow in size. In particular, "d" represents the width of each of depletion regions 138 and 140. This value increases as voltage is applied to contacts 128 and 130. In this example, "t" represents the width of channel 112 and also represents the conductivity. The overall conductivity is "t−2d" in which the conductivity decreases as d increases with the size of depletion regions 138 and 148.

Turning now to FIGS. 2A–2G, these diagrams illustrate cross-sections taken along the same line as for FIG. 1C during processing steps for creating the voltage controlled diffusion resistor in accordance with the preferred embodiments of the present invention. In FIG. 2A, the resistor 100 is formed in a p-well that has been previously formed. In a less preferred embodiment, the well can also be an n-well. To begin formation of the resistor, a layer of resist RST is deposited over the substrate, which includes the n-well or p-well. The resist is patterned and developed to expose the region where the resistor will be formed, but remains intact over adjacent regions. A p-type dopant is implanted into the device. In this example, the dopant may be, for example, boron. The implant is performed to result in a low concentration of p-type dopants. These dopants in these examples have a concentration of about $1\times10^{13}$ per $cm^3$ or greater. The doping profile of p-diffusion region 102 may be tuned in these examples to reduce parasitic capacitance.

In FIG. 2B, the previous photo resist layer has been removed and a new layer of resist RST has been deposited. This layer of resist has been developed to make a pattern that exposes those areas where the end terminals of the resistor will be. The device is then implanted with additional p-type dopant to create a high concentration of n-type dopants in contact regions 204 and 206. Typically, the concentration may range from $1\times10^{18}$ per $cm^3$ to $1\times10^{20}$ per $cm^3$.

In FIG. 2C, the existing resist layer has again been removed and a new resist RST deposited and patterned to expose diode contact regions 208 and 210. An n-type dopant, such as arsenic or phosphorus, is implanted. Typically, the concentration can range from $1\times10^{18}$ per $cm^3$ to $1\times10^{20}$ per $cm^3$.

In FIG. 2D, a new layer of resist RST is developed to expose contact regions 204, 206, 208, and 210 in the resistor. A refractory metal, such as titanium or cobalt, is deposited to form a thin layer over the exposed silicon regions, seen here as 214', 216', and 220'. The chip is then heated in a rapid thermal anneal process, which causes the refractory metal to react with the silicon substrate to form metal salicide regions 214, 216, 218, and 220, as seen in FIG. 2E.

After the salicide contacts are formed, a layer of an insulator, known as an interlevel dielectric ILD, is deposited. This layer can be composed of, for example, silicon dioxide, $SiO_2$. Preferably, the dielectric layer ILD is planarized using chemical mechanical processing (CMP), forming the structure of FIG. 2E. A resist (not shown) will be formed over the interlevel dielectric layer. The resist will be patterned using the same pattern previously used to determine where the refractory metal for the salicide would be deposited. The dielectric layer is then etched to remove the dielectric over the contact areas, forming the structures seen in FIG. 2F. Finally, a refractory metal such as tungsten is deposited into the contact regions thus exposed to form contacts 124, 126, 128, and 130, seen in FIG. 2G.

Notably, in these examples, lengths "L1" and "L2" of FIG. 1C and the width "t" of FIG. 1E are typically minimized in order to maximize the effect of the depletion regions on the total resistance. Preferably, the dimensions of the resistor are designed so that the depletions would not touch. However, even if the two depletion regions did touch, the substrate would provide enough carriers for some current flow, so that the device is always in the linear region.

Turning now to FIG. 3, a schematic diagram of a Rf driver or receiver circuit with RF feedback is depicted in accordance with a preferred embodiment of the present invention. In these examples, the RF feedback employs a variable resistor, such as the variable resistor in the illustrated examples. In this example, circuit 300 includes current source 302, transistor 304, resistor 306, and resistor 308. In these examples, resistor 306 is an Rd resistor connecting transistor 304 to ground. Current source 302 has one end connected to transistor 304 and another end connected to voltage source VDD. Further, transistor 304 and current source 302 are connected to Vout. Vin is connected to the gate of transistor 304 and resistor 308. In these examples, resistor 308 is a variable diffusion resistor as illustrated in the depicted examples.

Thus, the present invention in the illustrated examples provides for an adjustable or tunable resistance value in a diffusion resistor. The absolute value of the resistor in these examples may be modified with a voltage bias on the metal contact of the diode. By changing the voltage bias, the thickness of the depletion region may be increased or decreased. With this feature, impedance matching adjustment for radio frequency (Rf) driver/receiver circuits may be made. The voltage controlled diffusion resistor in the illustrated examples allows for adjustment of the resistor value Rin for a receiver application or Rout for a driver application to match the transmission line impedance. In this manner, unwanted voltage reflections and signal loss are reduced or eliminated.

Further, adjustments to resistance allow for a bias current adjustment for mixed signal circuits. Also, the reduction in the size of the resistor is accomplished by reducing the resistor thickness. Additionally, resistance values may be self-adjusting through various circuit design techniques, such as implementing a feedback circuit with the resistor of the present invention. Further, the variable resistance value may be adjusted to compensate for process variations to provide for uniform resistance. Also, the variable resistance may be adjusted to a very high resistance to put an analog circuit in a low current or low power sleep mode.

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. A diffusion resistor comprising:
   a substrate containing a well;
   a diffusion region formed within said well, said diffusion region having predominantly p-type dopants;
   a first contact region and a second contact region, both of said first and second contact regions extending down from a surface of said substrate and containing predominantly p-type dopants;
   a third contact region and a fourth contact regions, both of said third and fourth contact regions extending down from said surface of said substrate and containing predominantly n-type dopants, wherein said third and said fourth contact regions are located between said first and said second contact regions, said third and fourth contact regions defining a conduction channel therebetween; and
   first, second, third, and fourth contacts attached respectively to said first, said second, said third, and said fourth contact regions;
   wherein said first contact and said second contact form terminals of said diffusion resistor;
   wherein said third contact and said fourth contact each forms a diode such that application of a voltage to said third contact and said fourth contact forms respective depletion regions that change in size depending on a value of said voltage;
   whereby a resistance in the depletion resistor is changed by changing said voltage.

2. The diffusion resistor of claim 1, wherein said first contact, said second contact, said third contact, and said fourth contact are connected to said surface by respective salicided regions.

3. The diffusion resistor of claim 1, wherein said first contact, said second contact, said third contact, and said fourth contact are formed using a metal layer.

4. The diffusion resistor of claim 1, wherein said metal layer comprises tungsten.

5. The diffusion resistor of claim 1, wherein said diffusion region contains p-type dopants having a concentration of about $1\times10^{15}/cm^3$.

6. The diffusion resistor of claim 1, wherein said first contact region and said second contact region contain p-type dopants having a concentration of about $1\times10^{18}/cm^3$ to about $1\times10^{20}/cm^3$.

7. The diffusion resistor of claim 1, wherein said third contact region and said fourth contact region contain n-type dopants having a concentration of about $1\times10^{18}/cm^3$ to about $1\times10^{20}/cm^3$.

8. The diffusion resistor of claim 1, wherein said n-type dopant is arsenic or phosphorus and said p-type dopant is boron.

9. The diffusion resistor of claim 1, wherein said well is a p-well.

10. A method for forming a diffusion resistor, the method comprising:
   forming a well in a substrate;
   forming a diffusion region, having a predominantly p-type doping, in said well;
   forming a first contact region and a second contact region in said diffusion region, said first contact region and said second contact region extending downward from a surface of said substrate and each contain predominantly p-type doping;
   forming a third contact region and a fourth contact region between said first and said second contact regions, said third and said fourth contact regions extending downward from a surface of said substrate, comprising predominantly n-type doping, and defining a conduction channel therebetween; and
   forming a first contact, a second contact, a third contact, and a fourth contact respectively on said first contact region, said second contact region, said third contact region, and said fourth contact region;
   wherein said third contact and said fourth contact form respective diodes such that application of a voltage to said third contact or said fourth contact forms a respective depletion region that changes in size depending on the value of said voltage;
   whereby a resistance in the depletion resistor is changed by changing said voltage.

11. The method of claim 10, wherein said step of forming said diffusion region comprises:

implanting p-type dopants into said substrate.

12. The method of claim 11, wherein said p-type dopants implanted into said diffusion region have a concentration of about $1\times10^{15}/cm^3$.

13. The method of claim 11, wherein a doping profile of the p-type dopants is selected to reduce parasitic capacitance.

14. The method of claim 10, wherein said step of forming said first contact region and said second contact region comprises:

implanting n-type dopants into said depletion region in a concentration of about $1\times10^{18}/cm^3$ to about $1\times10^{20}/cm^3$.

15. The method of claim 10, wherein said step of forming said contacts comprises:

depositing a metal layer onto said first, second, third, and fourth contact regions.

16. The method of claim 15, further comprising the step of forming a salicide layer between each of said contacts and a respective contact region.

17. The method of claim 16, wherein said salicide layer comprises titanium.

18. The method of claim 15, wherein said metal layer is a tungsten metal layer.

19. The method of claim 10, wherein said well is a p-well.

* * * * *